(12) United States Patent
Hattori (10) Patent No.: US 10,306,770 B2
(45) Date of Patent: May 28, 2019

(54) THIN-FILM CAPACITOR MANUFACTURING METHOD, INTEGRATED CIRCUIT MOUNTING SUBSTRATE, AND SEMICONDUCTOR DEVICE EQUIPPED WITH THE SUBSTRATE

(71) Applicant: Noda Screen Co., Ltd., Aichi (JP)

(72) Inventor: Atsunori Hattori, Komaki (JP)

(73) Assignee: NODA SCREEN CO., LTD., Aichi (JP)

( * ) Notice: Subject to any disclaimer, the term of this patent is extended or adjusted under 35 U.S.C. 154(b) by 156 days.

(21) Appl. No.: 15/127,609

(22) PCT Filed: Mar. 11, 2015

(86) PCT No.: PCT/JP2015/057143
§ 371 (c)(1),
(2) Date: Sep. 20, 2016

(87) PCT Pub. No.: WO2016/143087
PCT Pub. Date: Sep. 15, 2016

(65) Prior Publication Data
US 2018/0177059 A1 Jun. 21, 2018

(51) Int. Cl.
*H01L 23/49* (2006.01)
*H05K 3/30* (2006.01)
(Continued)

(52) U.S. Cl.
CPC ............... *H05K 3/303* (2013.01); *H01G 4/33* (2013.01); *H01G 4/38* (2013.01); *H01L 21/4857* (2013.01);
(Continued)

(58) Field of Classification Search
CPC ............... H01L 23/49; H01L 23/49822; H01L 21/4857; H05K 1/162
See application file for complete search history.

(56) References Cited

U.S. PATENT DOCUMENTS 6,885,541 B2   4/2005  Otsuka et al.
7,841,075 B2   11/2010 Borland et al.
(Continued)

FOREIGN PATENT DOCUMENTS

JP  2005-33195   2/2005
JP  2005-252308  9/2005
(Continued)

OTHER PUBLICATIONS

International Search Report dated May 26, 2015 in International (PCT) Application No. PCT/JP2015/057143.
(Continued)

*Primary Examiner* — Phuc T Dang
(74) *Attorney, Agent, or Firm* — Wenderoth, Lind & Ponack, L.L.P.

(57) ABSTRACT

A method for manufacturing a thin-film capacitor in a circuit substrate includes: forming, on a dielectric film formed on a surface of a support member, a first electrode layer of the thin-film capacitor; forming, on the dielectric film and the first electrode layer, an insulating base material of the circuit substrate so as to bury the first electrode layer; removing the support member and exposing a surface of the dielectric film on a side opposite to the first electrode layer; patterning the dielectric film so as to leave a dielectric layer overlapping the first electrode layer; forming a first through hole in the dielectric layer so as to expose a part of a surface, on a dielectric layer side, of the first electrode layer; and forming a second electrode layer of the capacitor so as to overlap the dielectric layer including the inside of the first through hole.

6 Claims, 9 Drawing Sheets

(51) Int. Cl.
*H01G 4/33* (2006.01)
*H01G 4/38* (2006.01)
*H05K 3/46* (2006.01)
*H01L 23/64* (2006.01)
*H01L 49/02* (2006.01)
*H05K 1/02* (2006.01)
*H05K 1/16* (2006.01)
*H05K 3/00* (2006.01)
*H05K 3/32* (2006.01)
*H01L 23/498* (2006.01)
*H01L 21/48* (2006.01)

(52) U.S. Cl.
CPC ...... *H01L 23/49822* (2013.01); *H01L 23/642* (2013.01); *H01L 28/60* (2013.01); *H05K 1/0298* (2013.01); *H05K 1/162* (2013.01); *H05K 3/002* (2013.01); *H05K 3/32* (2013.01); *H05K 3/46* (2013.01); *H01L 23/49816* (2013.01); *H01L 23/49827* (2013.01); *H01L 23/49833* (2013.01); *H01L 2224/16225* (2013.01); *H01L 2924/15174* (2013.01); *H01L 2924/15311* (2013.01)

(56) References Cited

U.S. PATENT DOCUMENTS

| | | |
|---|---|---|
| 8,022,311 B2 | 9/2011 | Kim et al. |
| 2004/0264103 A1 | 12/2004 | Otsuka |
| 2007/0132063 A1* | 6/2007 | Min ............... H05K 1/162 257/532 |
| 2008/0212299 A1 | 9/2008 | Kim et al. |
| 2008/0316723 A1 | 12/2008 | Borland et al. |
| 2010/0200279 A1* | 8/2010 | Kariya ............ H01L 21/486 174/255 |
| 2011/0024174 A1* | 2/2011 | Ootsuka ........... H05K 1/0231 174/260 |

FOREIGN PATENT DOCUMENTS

| | | |
|---|---|---|
| JP | 2006-179743 | 7/2006 |
| JP | 2008-112852 | 5/2008 |
| JP | 2008-218966 | 9/2008 |
| JP | 2009-43769 | 2/2009 |
| JP | 2010-530644 | 9/2010 |
| JP | 2013-89614 | 5/2013 |
| JP | 2013-089614 | 5/2013 |
| TW | 200913812 | 3/2009 |

OTHER PUBLICATIONS

Written Opinion of the International Searching Authority dated May 26, 2015 in International (PCT) Application No. PCT/JP2015/057143, with English translation.

* cited by examiner

THIN-FILM CAPACITOR MANUFACTURING METHOD, INTEGRATED CIRCUIT MOUNTING SUBSTRATE, AND SEMICONDUCTOR DEVICE EQUIPPED WITH THE SUBSTRATE

TECHNICAL FIELD

The present invention relates to a thin-film capacitor manufacturing method, an integrated circuit mounting substrate, and a semiconductor device equipped with the substrate, and more particularly relates to a thin-film capacitor for decreasing the impedance in a power supply circuit for an integrated circuit.

BACKGROUND ART

Conventionally, as an example of the above type of thin-film capacitor, a technology disclosed in Patent Document 1 is known. Patent Document 1 discloses a thin-film capacitor 10 which is a laminated capacitor usable as an intermediate substrate, and with which a routing wiring portion that can cause an increase in inductance can be effectively eliminated, whereby a lower impedance and a wider band can be achieved.

Patent Document 1: Japanese Patent Application Laid-Open No. 2005-33195

Problem to be Solved by the Invention

However, in the conventional thin-film capacitor 10, as illustrated in FIG. 1 and FIG. 4 of Patent Document 1, for example, an integrated circuit 2 and electrodes 14, 17 of the thin-film capacitor 10 are connected via terminals 5a, 5b of a terminal array 5. Accordingly, in high frequency regions, there is a concern for the influence of the terminals 5a, 5b of the terminal array 5 on an increase in inductance. In addition, in the invention described in Patent Document 1, when a solder connection portion 6 of the integrated circuit 2 is flip-chip connected to the terminal array 5, no consideration is given to the flatness of the top of a capacitor (intermediate substrate) 1 on which the thin-film capacitor 10 is formed.

When a thin-film capacitor is fabricated on a substrate, the resultant structure is such that a dielectric layer is laminated between two or more pairs of metal electrode layers, as according to the technology of Patent Document 1. While the tendency is toward making the dielectric layer as thin as possible for achieving higher capacitance, there is a limit, from the viewpoint of reducing impedance, placed on how thin the upper and lower metal electrode layers can be made, as the thinning involves an increase in resistance. Accordingly, a thickness of 5 to 10 µm (micrometers) per layer is required, for example. This means that a step with a height of a maximum of 10 to 20 µm will be produced at the thin-film capacitor portion with reference to the substrate surface. As a result, the reliability of the flip-chip connection and the like is reduced.

In light of the above circumstance, there is a need for a thin-film capacitor substrate with which the impedance of a power supply circuit can be further decreased by means of a thin-film capacitor, and which ensures the flatness of the top of the substrate in which the thin-film capacitor is formed, and for a method for manufacturing the same.

DISCLOSURE OF THE PRESENT INVENTION

Accordingly, the present description provides a method for manufacturing a thin-film capacitor that can ensure the flatness of the top of the circuit substrate in which the thin-film capacitor is formed, while the impedance associated with the wiring for the thin-film capacitor is decreased; an integrated circuit mounting substrate; and a semiconductor device equipped with the substrate.

Means for Solving the Problem

A thin-film capacitor manufacturing method disclosed in the present description is a method for manufacturing a thin-film capacitor in a circuit substrate, the method including: a dielectric film forming step of forming a dielectric film on a surface of a support member; a first electrode forming step of forming a first electrode layer of the thin-film capacitor on the dielectric film in a required pattern; a base material forming step of forming, on the dielectric film and the first electrode layer, an insulating base material of the circuit substrate so as to bury the first electrode layer; a removal step of removing the support member and exposing a surface of the dielectric film on a side opposite to the first electrode layer; a dielectric patterning step of patterning the dielectric film so as to leave a dielectric layer overlapping the first electrode layer, and forming a first through hole in the dielectric layer so as to expose a part of a surface, on a dielectric layer side, of the first electrode layer; and a second electrode forming step of forming a second electrode layer of the thin-film capacitor so as to overlap the dielectric layer including an inside of the first through hole.

In this configuration, the first electrode layer of the thin-film capacitor is formed buried in the insulating base material of the circuit substrate. The second electrode layer of the thin-film capacitor is formed on the dielectric layer over the surface of the insulating base material of the circuit substrate. The dielectric layer includes the first through hole formed so as to expose a part of the surface, on the dielectric layer side, of the first electrode layer, and the second electrode layer of the thin-film capacitor is formed so as to overlap the dielectric layer including the inside of the first through hole. The second electrode layer formed in the first through hole is connected to the first electrode layer. Accordingly, by insulating the second electrode layer formed in the first through hole from the other second electrode layer, an external connection portion for connecting the first electrode layer to external circuitry, such as an integrated circuit, can be provided.

In this way, on the surface of the insulating base material of the circuit substrate, the height difference between the upper surface of the second electrode layer formed in the first through hole (the upper surface of the external connection portion of the first electrode layer) and the upper surface of the second electrode layer formed on the dielectric layer can be made due only to the thickness of the dielectric layer. Because the thickness of a dielectric layer is normally very small compared with the thicknesses of respective electrodes, the flatness of the top of the circuit substrate in which the thin-film capacitor is formed can be ensured. In addition, a part of the first electrode layer (the external connection portion of the first electrode layer) and the second electrode layer are exposed on the top of the circuit substrate. Accordingly, when the thin-film capacitor is connected to the bumps of an integrated circuit, the thin-film capacitor can be directly connected to the bumps without the interposition of other wiring. Accordingly, the flatness of the top of the circuit substrate in which the thin-film capacitor is formed can be ensured while the inductance associated with the wiring for the thin-film capacitor, i.e., impedance, is decreased.

In the thin-film capacitor manufacturing method, the circuit substrate may be an integrated circuit mounting substrate on which an integrated circuit is to be mounted. The second electrode forming step may include forming a first external connection portion connected to the first electrode layer, the first external connection portion being configured to be applied with a power supply voltage of one polarity for the integrated circuit and being configured to be connected to the integrated circuit when the integrated circuit is mounted. The second electrode layer may include a second external connection portion configured to be applied with a power supply voltage of the other polarity for the integrated circuit, and configured to be connected to the integrated circuit when the integrated circuit is mounted. The first electrode forming step may include forming a second electrode supplementary portion at a position opposing the second external connection portion of the second electrode layer, the second electrode supplementary portion being connected to the second electrode layer. The dielectric patterning step may include forming a second through hole in the dielectric layer by removing the dielectric film at a position opposing the second electrode supplementary portion.

According to this configuration, the height of the first external connection portion of the first electrode layer and the height of the second external connection portion of the second electrode layer can be made substantially the same, whereby the difference in height can be made substantially zero. Accordingly, when the integrated circuit is mounted on the integrated circuit mounting substrate, the flatness associated with the connection of the integrated circuit and the thin-film capacitor can be further ensured, while the impedance associated with the wiring for the thin-film capacitor is decreased.

In the thin-film capacitor manufacturing method, the first electrode forming step may include a first plating step of increasing a film thickness of the first electrode layer, and the second electrode forming step may include a second plating step of increasing a film thickness of the second electrode layer.

According to this configuration, by adjusting the thickness of the first electrode layer and the second electrode layer of the thin-film capacitor, desired resistance values for the first electrode and second electrode of the thin-film capacitor can be obtained.

An integrated circuit mounting substrate disclosed in the present description may include: an insulating base material having a mounting surface on which an integrated circuit is to be mounted; and a thin-film capacitor formed on a mounting surface side of the insulating base material, and including a first electrode layer, a second electrode layer, and a dielectric layer formed between the first electrode layer and the second electrode layer. The first electrode layer of the thin-film capacitor may be formed so as to be buried in the insulating base material from the mounting surface. The dielectric layer may include a first through hole in which a first external connection portion connected to the first electrode layer is formed, the first external connection portion being configured to be applied with a power supply voltage of one polarity for the integrated circuit, and being configured to be connected to the integrated circuit when the integrated circuit is mounted. The second electrode layer of the thin-film capacitor may be formed on the dielectric layer.

According to this configuration, over the mounting surface of the integrated circuit mounting substrate, the height difference between the upper surface of the exposed portion of the first electrode layer (the first external connection portion of the first electrode layer) and the upper surface of the second electrode layer can be made due only to the thickness of the dielectric layer. Accordingly, the flatness of the top of the circuit substrate in which the thin-film capacitor is formed can be ensured while the inductance associated with the wiring for the thin-film capacitor, i.e., impedance, is decreased. The "mounting surface" herein more specifically refers to a surface on which the integrated circuit is to be indirectly mounted, as opposed to a surface of the substrate on which the integrated circuit is to be directly mounted. In other words, the "mounting surface" refers to the surface of the insulating base material on the side on which the integrated circuit is to be mounted.

In the integrated circuit mounting substrate, the first external connection portion may be made of a metal film constituting the second electrode layer. The second electrode layer may include a second external connection portion configured to be applied with a power supply voltage of the other polarity for the integrated circuit, and configured to be connected to the integrated circuit when the integrated circuit is mounted. The dielectric layer may include a second through hole in which the second external connection portion is formed.

According to this configuration, the height of the first external connection portion of the first electrode layer and the height of the second external connection portion of the second electrode layer can be made substantially the same, whereby the difference in height can be made substantially zero. Accordingly, when the integrated circuit is mounted on the integrated circuit mounting substrate, the flatness associated with the connection of the integrated circuit and the thin-film capacitor can be further ensured while the impedance associated with the wiring for the thin-film capacitor is decreased.

In the integrated circuit mounting substrate, the thin-film capacitor may include a second electrode supplementary portion made of a metal film constituting the first electrode layer, and connected to the second external connection portion of the second electrode layer. The integrated circuit mounting substrate may further include an external connection surface for external connection on a side opposite to the mounting surface, a connection pad formed on the external connection surface, a first via plug formed in the insulating base material and connecting the connection pad and the first electrode layer, and a second via plug formed in the insulating base material and connecting the connection pad and the second electrode supplementary portion.

According to this configuration, at the second external connection portion of the second electrode layer, the second electrode supplementary portion is formed. Accordingly, the reliability with respect to stress when the integrated circuit is connected to the integrated circuit mounting substrate can be increased. In addition, after the integrated circuit is mounted on the integrated circuit mounting substrate, electric power can be supplied to the integrated circuit in a simple structure via the integrated circuit mounting substrate from an external power supply.

A semiconductor device disclosed in the present description may include any of the above integrated circuit mounting substrates, and an integrated circuit mounted on the integrated circuit mounting substrate.

According to this configuration, in the semiconductor device equipped with the integrated circuit mounting substrate including the thin-film capacitor, the flatness of the mounting surface of the integrated circuit mounting substrate in which the thin-film capacitor is formed can be ensured while the impedance associated with the wiring for the thin-film capacitor is decreased.

In the semiconductor device, the integrated circuit may be a semiconductor chip, and the semiconductor chip may be flip-chip mounted on the integrated circuit mounting substrate.

According to this configuration, in the semiconductor device in which the semiconductor chip is flip-chip mounted on the mounting surface of the integrated circuit mounting substrate, the flatness of the mounting surface of the integrated circuit mounting substrate can be ensured in a preferable manner. At the time of flip-chip mounting on an integrated circuit mounting substrate, the flatness of the mounting surface of the integrated circuit mounting substrate, and specifically the flatness of abutting portions (external connection portions) of the mounting substrate on which connection bumps of a semiconductor chip are abutted, is important, and the demand for the flatness is stringent. Such demand can be addressed by this configuration in a preferable manner.

Advantageous Effect of the Invention

According to the present invention, the flatness of the top of the circuit substrate in which the thin-film capacitor is formed can be ensured while the impedance associated with the wiring for the thin-film capacitor is decreased.

BRIEF DESCRIPTION OF THE DRAWINGS

FIGS. 5J to 5M are schematic partial cross sectional views illustrating the method for manufacturing the circuit substrate (thin-film capacitor);

BEST MODE FOR CARRYING OUT THE INVENTION

Embodiment

An embodiment will be described with reference to FIG. 1 to FIG. 5. In the figures, similar reference symbols indicate similar or corresponding portions.

1. Configuration of Semiconductor Device

Figure 1:
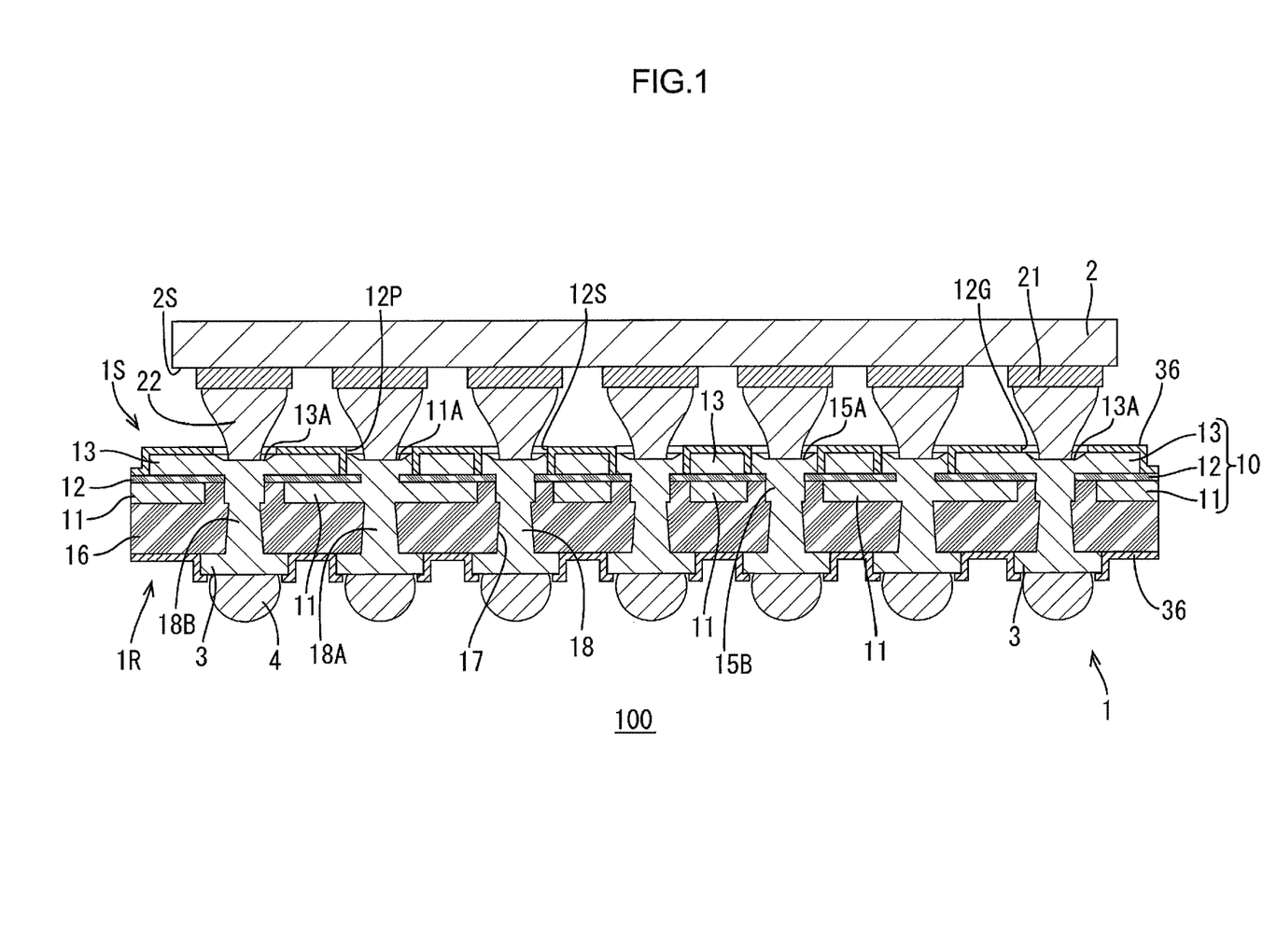
FIG. 1 is a schematic cross sectional view of a semiconductor device according to an embodiment.

As illustrated in FIG. 1, a semiconductor device 100 generally includes a flip-chip mounting substrate (an example of "circuit substrate" and "integrated circuit mounting substrate") 1 and an LSI chip (an example of "integrated circuit" and "semiconductor chip") 2. FIG. 1 is a cross sectional view of the semiconductor device 100 corresponding to the position indicated by a dot-and-dash line A-A in FIG. 2.

On a surface 2S on a bonding side of the LSI chip 2, as illustrated in FIG. 1, a plurality of electrode pads 21 is formed. On each of the electrode pads 21, a bump 22 for flip-chip mounting the LSI chip 2 on the flip-chip mounting substrate (hereafter simply referred to as the "substrate") 1 is formed. The bump 22 according to the present embodiment is an Au (gold) stud bump, for example.

The substrate 1, as illustrated in FIG. 1, is provided with a number of external connection pads (an example of "connection pad") 3 on a back side surface (an example of "external connection surface") 1R of an insulator portion (an example of "insulating base material") 16 serving as a base. The external connection pads 3 are used for mounting the semiconductor device 100 to a circuit substrate, such as a motherboard, which is not illustrated, via solder balls, for example. On a front side surface (an example of "mounting surface") 1S of the insulator portion 16, a thin-film capacitor 10 configured as will be described below is provided. The thin-film capacitor 10 is connected in parallel with a power supply circuit (not illustrated) for the LSI chip 2. On the front side surface 1S of the insulator portion 16, there is also formed a plurality (three at the center in FIG. 1) of signal electrodes 15 penetrating through the above-described thin-film capacitor 10. Each of the signal electrodes 15 has two layers of a chip connection portion 15A and a pad connection portion 15B that are integrated with each other, as will be described in detail later. The signal electrodes 15 are connected to the external connection pads 3 via a plurality of via plugs 18 buried in the insulator portion 16.

The insulator portion 16 is made of a pre-preg sheet that has been cured, for example, and positioned between the front side surface of the substrate 1, on which the LSI chip 2 is mounted, and the back side surface thereof. Specifically, the insulator portion 16 is positioned between a dielectric layer 12 of the thin-film capacitor 10 which will be described below and the back side surface.

Figure 2:
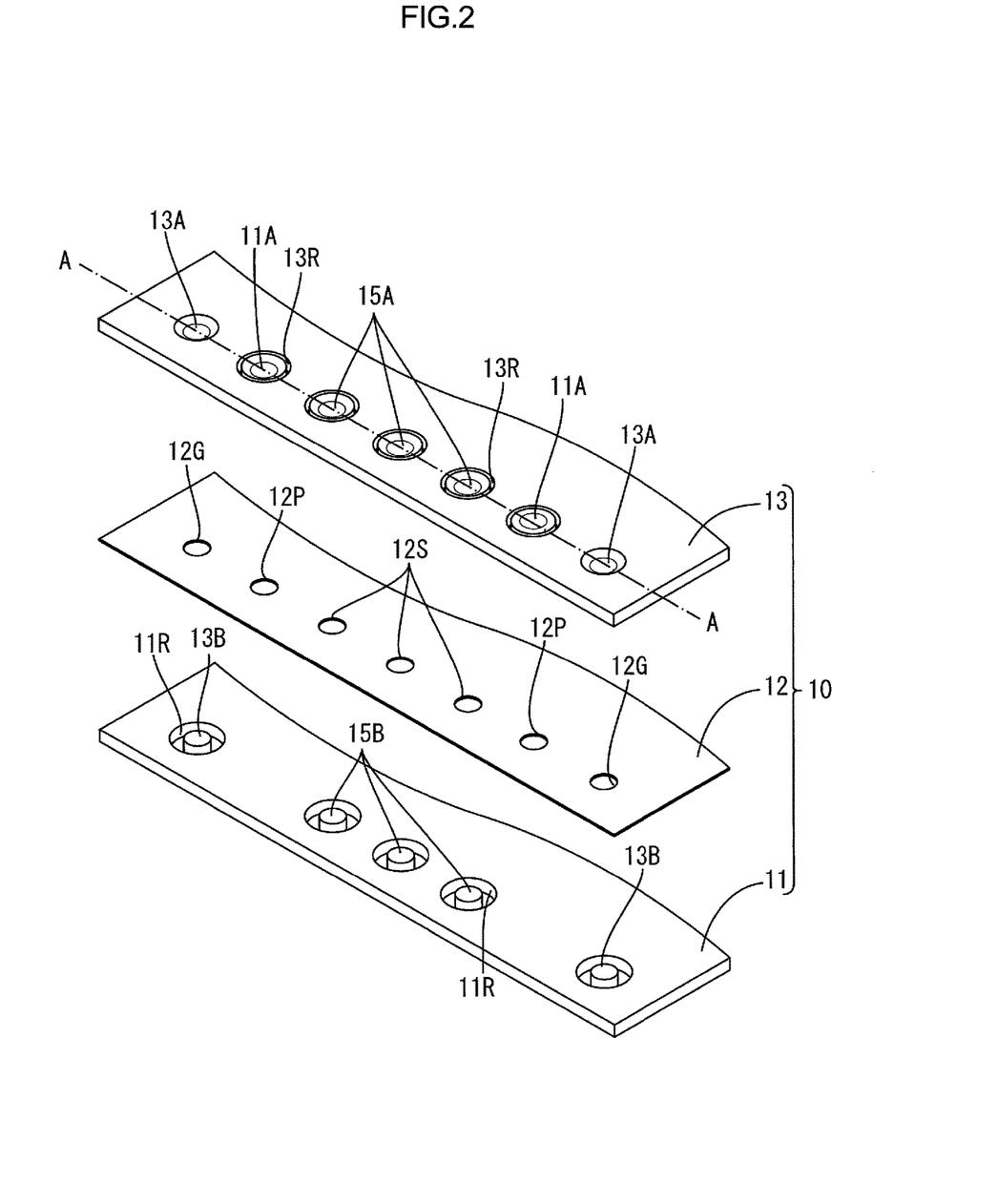
FIG. 2 is a schematic exploded perspective view of a part of the thin-film capacitor.

The thin-film capacitor 10 is provided on the front side surface 1S side of the insulator portion 16, and, as illustrated by an exploded, layer-by-layer view of FIG. 2, includes three layers, i.e., a first electrode layer 11, a dielectric layer 12, and a second electrode layer 13, which are stacked in that order. In FIG. 2, the first electrode layer 11 corresponds to a first electrode of the thin-film capacitor 10; the dielectric layer 12 corresponds to a dielectric portion of the thin-film capacitor 10; and the second electrode layer 13 corresponds to a second electrode of the thin-film capacitor 10.

The first electrode layer 11 is formed so as to be buried in the insulator portion 16 from the front side surface of the substrate 1, or more specifically, from the front side surface 1S of the insulator portion 16. The first electrode layer 11 is connected to the LSI chip 2 via chip connection portions 13A. To the first electrode layer 11, the positive power supply voltage (an example of "power supply voltage of one polarity"), for example, for the LSI chip 2 is applied. As illustrated in FIG. 2, the first electrode layer 11 has a plurality of annular slits 11R formed therein by patterning as will be described later. As illustrated in FIG. 2, the annular slits 11R place second electrode supplementary portions 13B and the pad connection portions 15B, both positioned inside the annular slits 11R, in an electrically insulated state from the other first electrode layer 11 positioned on the outside.

On the second electrode supplementary portions 13B and the pad connection portions 15B, the chip connection portions 13A and 15A are layered through the dielectric layer 12, as will be described later, thus electrically connecting the respective portions (see FIG. 1).

The dielectric layer 12 is formed on the first electrode layer 11. The dielectric layer 12, as illustrated in FIG. 2, has through holes 12P (an example of "first through hole") for connecting the first electrode layer 11 and chip connection portions (an example of " ") 11A; through holes 12G (an example of "second through hole") for connecting the chip connection portions (an example of "second external connection portion") 13A of the second electrode layer 13 and the second electrode supplementary portions 13B; and through holes 12S for connecting the chip connection portions 15A of the signal electrodes 15 and the pad connection portions 15B. The through holes are formed by patterning. The locations of the through holes 12G, 12P, and 12S formed in the dielectric layer 12 are not limited to those illustrated in FIG. 2. The through holes 12G, 12P, and 12S only need to be formed in the dielectric layer 12 at positions corresponding to the positions of the bumps 22 of the LSI chip 2.

The second electrode layer 13 is formed on the dielectric layer 12. The second electrode layer 13 is connected to the LSI chip 2 via the chip connection portion 13A. To the second electrode layer 13, ground voltage that is, for example, a negative power supply voltage (an example of "power supply voltage of the other polarity") is applied. In the second electrode layer 13, as illustrated in FIG. 2, a plurality of annular slits 13R is formed by patterning. As illustrated in FIG. 2, the annular slits 13R place the chip connection portions 11A of the first electrode layer 11 and the chip connection portions 15A of the signal electrodes 15, both positioned inside the annular slits 13R, in an electrically insulated state from the other second electrode layer 13 positioned on the outside.

The signal electrodes 15 are electrodes for the transmission and reception of signals to or from the LSI chip 2, and include the chip connection portions 15A for connection with the LSI chip 2, and the pad connection portions 15B for connection with the external connection pads 3. The chip connection portions 15A are formed simultaneously with the formation of the second electrode layer 13. The pad connection portions 15B are formed simultaneously with the formation of the first electrode layer 11.

The external connection pads 3, as illustrated in FIG. 1, are disposed on the back side surface 1R of the insulator portion 16 (substrate 1) at the same pitch as the pitch of the bumps 22 of the LSI chip 2, and there are as many external connection pads 3 as there are the bumps 22. However, this is not a limitation. For example, the area of the substrate 1 may be greater than the area of the LSI chip 2, a predetermined wiring pattern may be formed on the back side surface 1R of the insulator portion 16, and the pitch of the external connection pads 3 may be greater than the pitch of the bumps 22 of the LSI chip 2. In this case, the number of the external connection pads 3 and that of the bumps 22 of the LSI chip 2 may not be the same.

The insulator portion 16 has a plurality of via holes 17 penetrating through the insulator portion 16 from the back side surface 1R side of the substrate 1 to the electrode layers (11, 13) and the signal electrodes 15 of the thin-film capacitor 10. The via holes 17 may be formed by means of a carbon dioxide laser, for example. The electrode layers (11, 13) and the signal electrodes 15 are electrically connected with the external connection pads 3 by way of the via plugs 18, with which the via holes 17 are filled. The via plugs 18 are formed by copper plating, for example.

The external connection pads 3 are provided with solder balls 4 for external connection. That is, the semiconductor device 100 is a BGA-type semiconductor device. Note, however, that this is not a limitation, and the semiconductor device may be a land grid array (LGA)-type semiconductor device not provided with the solder balls 4.

The front side surface 1S and back side surface 1R of the insulator portion 16 (substrate 1) are protected by solder resist layers 36. The gap or the like between the LSI chip 2 and the front side surface 1S of the substrate 1 is filled with a known underfill resin (not illustrated).

2. Method for Manufacturing Semiconductor Device (Thin-Film Capacitor)

Figure 3A:
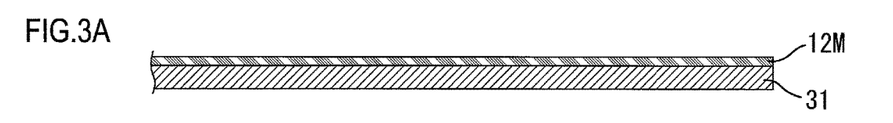
FIGS. 3A to 3E are schematic partial cross sectional views illustrating a method for manufacturing a circuit substrate (thin-film capacitor)
Figure 3B:
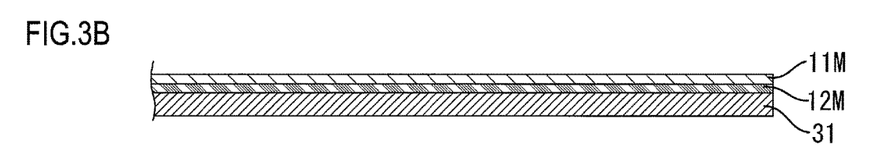
Figure 3C:
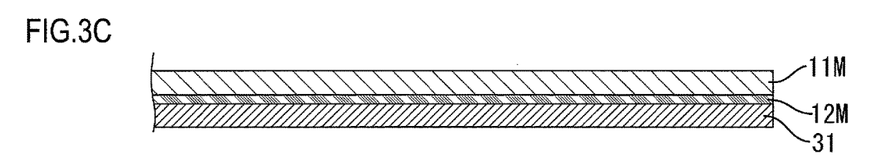
Figure 3D:
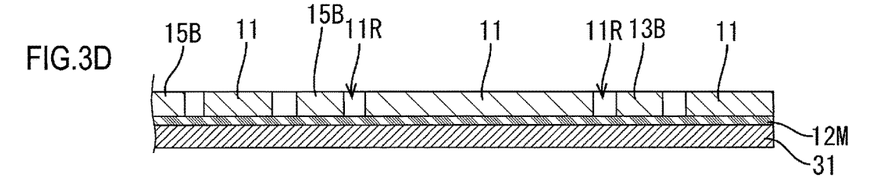
Figure 3E:
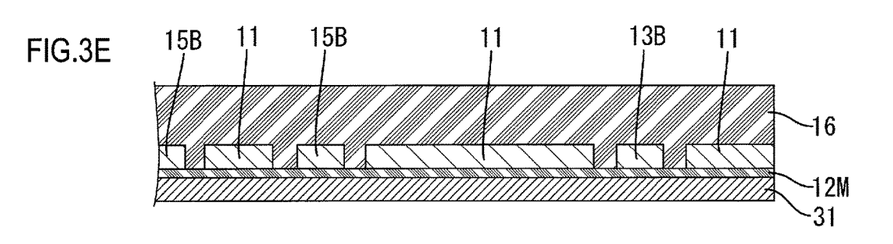
Figure 4F:
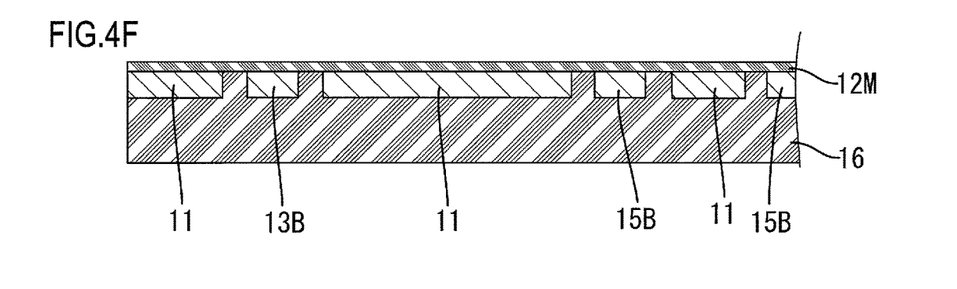
FIGS. 4F to 4I are schematic partial cross sectional views illustrating the method for manufacturing the circuit substrate (thin-film capacitor)
Figure 4G:
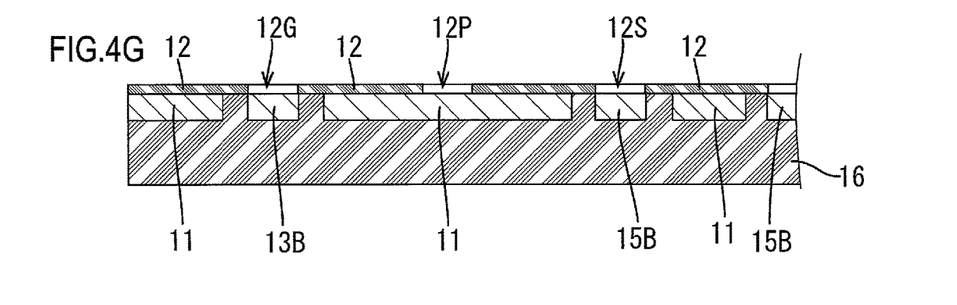
Figure 4H:
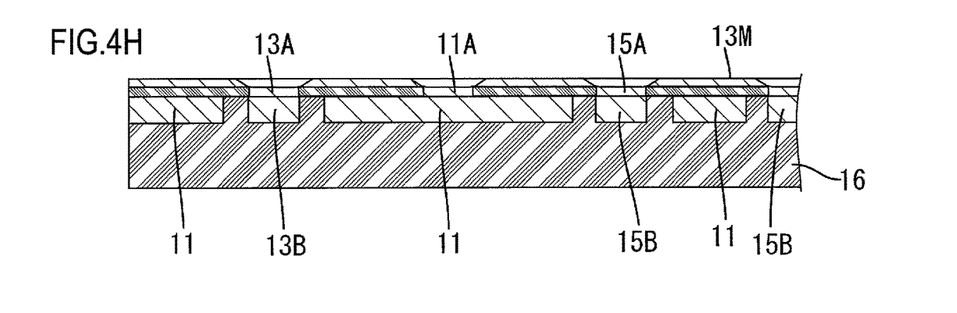
Figure 4I:
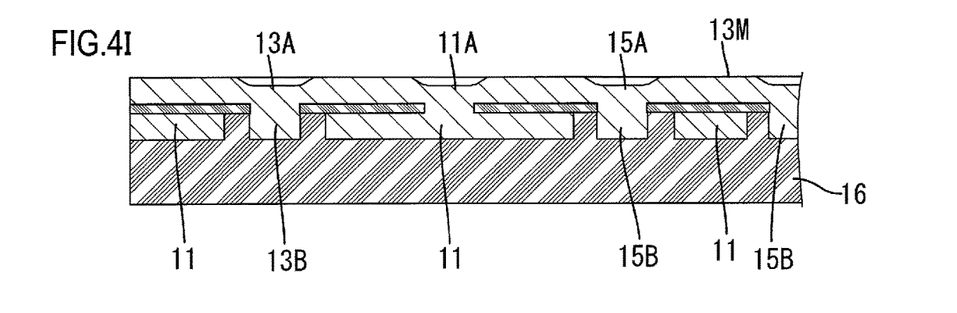
Figure 5J:
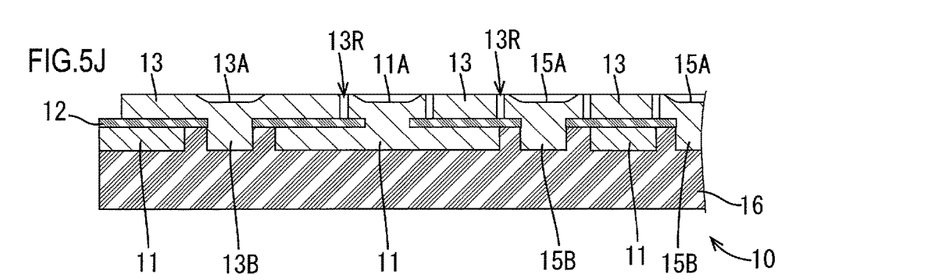
Figure 5K:
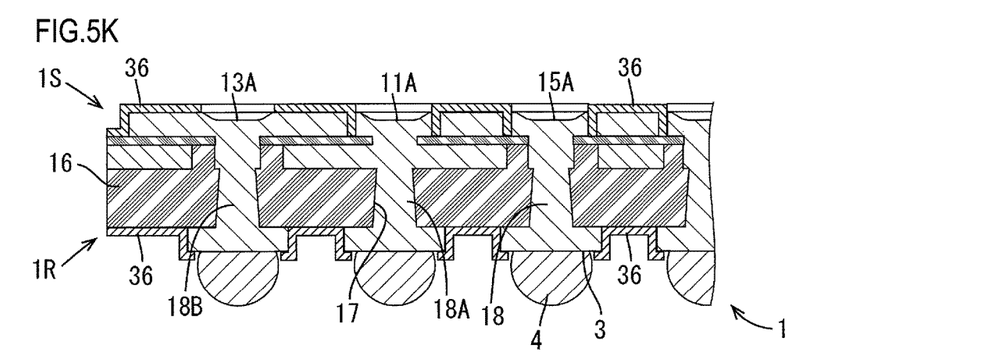
Figure 5M:
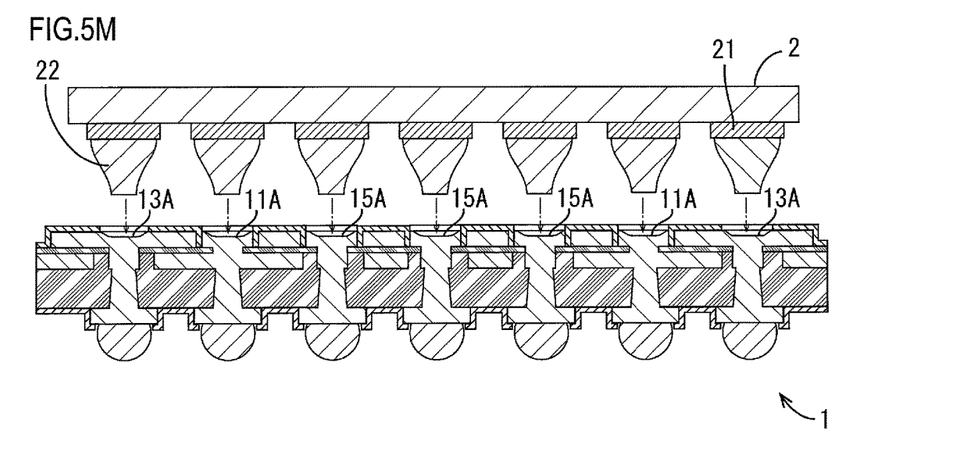

With reference to FIG. 3 to FIG. 5, a method for manufacturing the semiconductor device 100 will be described. Of the method for manufacturing the semiconductor device 100, FIG. 3A to FIG. 5J illustrate a method for manufacturing the thin-film capacitor 10. FIG. 3 is reversed in terms of the top-bottom relationship with respect to FIG. 1. The order of the manufacturing steps illustrated in FIG. 3 to FIG. 5 is exemplary and not intended to be limiting.

According to the manufacturing method, first, as illustrated in FIG. 3A, on the surface of an aluminum base material 31 that has been dry-washed, for example, a strontium titanate (STO) film (an example of "dielectric film") 12M is formed by aerosol chemical vapor deposition (AS-CVD) process (an example of "dielectric film forming step"). The STO film 12M has a film thickness value ranging from 0.1 μm to 0.4 μm, for example. The STO film 12M provides the dielectric layer 12 of the thin-film capacitor 10. The aluminum base material 31, which is made of an aluminum foil, is an example of "support member". The metal foil as the support member is not limited to the aluminum foil, and may be a metal foil of, e.g., copper or nickel. The dielectric film is also not limited to the STO film 12M.

Then, as illustrated in FIG. 3B, on the STO film 12M, a metal thin-film 11M for providing the first electrode layer 11 of the thin-film capacitor 10 is formed. The metal thin-film 11M is made of a Cu (copper) thin-film, for example. The Cu thin-film is formed by sputtering, for example.

Then, as illustrated in FIG. 3C, the thickness of the metal thin-film 11M is increased by, e.g., electroplating (an example of "first plating step"). The thickness of the metal thin-film 11M preferably has a value between 3 μm and 10 μm, for example. By thus adjusting the thickness of the metal thin-film 11M, a desired resistance value for the first electrode layer 11 of the thin-film capacitor 10 can be obtained. The plating step for increasing the thickness of the metal thin-film 11M may be omitted.

Then, as illustrated in FIG. 3D, the metal thin-film 11M is patterned to form the first electrode layer 11 (an example of "first electrode forming step"). There is also formed the annular slits 11R, whereby the second electrode supplementary portions 13B of the second electrode layer 13 and the pad connection portions 15B of the signal electrodes 15, both of which having a circular planar shape, are formed in an electrically insulated state from the first electrode layer 11 (see FIG. 2).

Then, as illustrated in FIG. 3E, on the STO film 12M and the first electrode layer 11, the insulator portion 16 is formed by, for example, heating and pressure-bonding a bismaleimide triazine (BT) resin (pre-preg sheet)(an example of "base material forming step"). The insulator portion 16 is not limited to the BT resin.

Then, as illustrated in FIG. 4F, the aluminum base material 31 is melted and removed by, for example, wet etching, so as to expose the surface of the STO film 12M on the side opposite to the surface on which the first electrode layer 11 is formed (an example of "removal step"). The surface of the STO film 12M after the aluminum base material 31 has been removed may be subjected to a desmut (smut removal) process, for example.

Then, as illustrated in FIG. 4G, using a patterned resist film (not illustrated) as a mask, the STO film 12M is patterned to form the dielectric layer 12 of the thin-film capacitor 10 (an example of "dielectric patterning step"). In the dielectric layer 12, the through holes 12G, 12P, and 12S (see FIG. 2) are also formed. In the present embodiment, as illustrated in FIG. 1 and FIG. 2, almost the entire STO film 12M except for the through holes 12G, 12P, and 12S is left to provide the dielectric layer 12. In other words, the thin-film capacitor 10 is formed in almost the entire region on the mounting surface 1S of the insulator portion 16 (substrate 1). Note, however, that this is not a limitation, and that the STO film 12M may be removed in portions other than the through holes 12G, 12P, and 12S, by patterning the STO film 12M. That is, the thin-film capacitor 10 may be formed while leaving a partial region on the mounting surface 1S of the substrate 1.

Then, as illustrated in FIG. 4H, on the surface of the STO film 12 on the side opposite to the surface on which the first electrode layer 11 is formed, a metal thin-film 13M for providing the second electrode layer 13 of the thin-film capacitor 10 is formed. The metal thin-film 13M is made of a Cu thin-film, for example, as in the case of the metal thin-film 11M. The Cu thin-film may be formed by sputtering, for example.

The metal thin-film 13M thus formed penetrates through the through holes 12G, 12P, and 12S, and reaches the first electrode layer 11 side, as illustrated in FIG. 4H. As a result, the metal thin-film 13M (chip connection portion 13A) and the second electrode supplementary portions 13B of the second electrode layer 13 are integrated via the through holes 12G of the dielectric layer 12. The metal thin-film 13M (chip connection portion 11A) and the portion of the first electrode layer 11 opposite the chip connection portion 11A are integrated via the through holes 12P of the dielectric layer 12. The metal thin-film 13M (chip connection portions 15A) and the pad connection portions 15B of the signal electrodes 15 are integrated via the through holes 12S of the dielectric layer 12.

Then, as illustrated in FIG. 4I, the thickness of the metal thin-film 13M is increased by electroplating, for example (an example of "second plating step"). The thickness of the metal thin-film 13M preferably has a value between 3 μm and 10 μm, for example, as in the case of the metal thin-film 11M. By thus adjusting the thickness of the metal thin-film 13M, a desired resistance value for the second electrode layer 13 of the thin-film capacitor 10 can be obtained. The plating step for increasing the thickness of the metal thin-film 13M may be omitted.

Then, as illustrated in FIG. 5J, the metal thin-film 13M is patterned to form the second electrode layer 13 (an example of "second electrode forming step"). Specifically, the chip connection portions 11A of the first electrode layer 11, and the chip connection portions 15A of the signal electrodes 15, both of which having a circular planar shape, are formed in an electrically insulated state, due to the annular slits 13R, from the second electrode layer 13 (see FIG. 2).

Through the above-described steps, the thin-film capacitor 10 and the signal electrodes 15 are formed. In FIG. 4I and the subsequent figures, the first electrode layer 11 and the chip connection portions 11A, the second electrode layer 13 and the second electrode supplementary portions 13B, and the chip connection portions 15A and the pad connection portions 15B of the signal electrodes 15 are respectively illustrated as being integral as they are respectively formed from the same material in the present embodiment.

Then, as illustrated in FIG. 5K, the back side surface 1R of the substrate 1 is irradiated with carbon dioxide laser, for example, so as to form the via holes 17. The via holes 17 are then filled with plating metal, which is Cu in the present embodiment, by electrolytic plating, for example, whereby the via plugs 18 are formed. The via plugs 18 include the first via plugs 18A connecting the external connection pads 3 and the first electrode layer 11, and the second via plugs 18B connecting the external connection pads 3 and the second electrode supplementary portions 13B.

At positions opposite the via plugs 18, the external connection pads 3 are then formed using well-known technology. Then, using well-known technology, protection films, such as the solder resist layers 36, are formed at locations except where the external connection pads 3 and the respective chip connection portions 11A, 13A, and 15A are formed, and solder balls are attached to the external connection pads 3.

Then, as illustrated in FIG. 5M, the bumps 22 formed on the electrode pads 21 of the LSI chip 2, which in the present embodiment are Au stud bumps, are bonded to the respective chip connection portions 11A, 13A, and 15A in the top of the substrate 1, using ultrasonic vibration bonding equipment, for example. In this way, the LSI chip 2 is flip-chip mounted on the substrate 1, whereby the semiconductor device 100 illustrated in FIG. 1 is formed.

The bumps 22 are not limited to the Au stud bumps, and may be micro solder bumps and the like, for example. In this case, the bumps 22 (micro solder bumps) are preferably made from a material having low elasticity.

3. Effects of the Embodiment

As described above, the first electrode layer 11 of the thin-film capacitor 10 is formed buried in the insulator portion 16 of the substrate 1. The second electrode layer 13 of the thin-film capacitor 10 is formed on the dielectric layer 12 on the front side surface (mounting surface) 1S of the insulator portion 16 of the substrate 1. The chip connection portions 11A of the first electrode layer 11 are formed of the metal thin-film 13M in the first through holes 12P. The chip connection portions 13A of the second electrode layer 13 are formed of the metal thin-film 13M in the second through holes 12G. In this way, on the front side surface 1S of the insulator portion 16, the difference between the height of the chip connection portions 11A of the first electrode layer 11 and the chip connection portions 13A of the second electrode layer 13, and the height of the second electrode layer 13 can be made due only to the thickness of the dielectric layer 12 (which is, for example, between 0.1 μm and 0.4 μm). Accordingly, the flatness of the top of the substrate 1 in which the thin-film capacitor 10 is formed can be ensured.

The chip connection portions 11A of the first electrode layer 11 and the chip connection portions 13A of the second electrode layer 13 are exposed on the top of the substrate 1. Accordingly, when the thin-film capacitor 10 and the bumps 22 of the LSI chip 2 are connected, the connections to the bumps 22 can be made directly without interposing other wiring. As a result, the inductance associated with the wiring for the thin-film capacitor 10, namely impedance, can be decreased. Thus, according to the present embodiment, the flatness of the top of the substrate 1 in which thin-film capacitor 10 is formed can be ensured, while the impedance associated with the wiring for the thin-film capacitor 10 is decreased.

The difference in height among the chip connection portions 11A of the first electrode layer 11, the chip connection portions 13A of the second electrode layer 13, and the chip connection portions 15A of the signal electrodes 15 can be made substantially zero. Accordingly, when the LSI chip 2 is bonded to the substrate 1, a substantially constant distance can be maintained between the bumps 22 of the LSI chip 2 and the chip connection portions 11A of the first electrode layer 11, the chip connection portions 13A of the second electrode layer 13, and the chip connection portions 15A of the signal electrodes 15, whereby the reliability of the bonds between the LSI chip 2 and the substrate 1 is increased. In other words, the reliability of the bonding by the bumps 22 is increased.

The structure of connection of the bumps 22 of the LSI chip 2 and the second electrode layer 13 is a dual structure of the chip connection portions 13A and the second electrode supplementary portions 13B without the interposition of the dielectric layer 12. Accordingly, compared with a case where the dielectric layer 12 is interposed, high reliability can be obtained with respect to the stress at the time of mounting the LSI chip 2, or the stress affecting long-term reliability. Thus, the dual structure enables utilization of micro solder bumps and the like as the bumps 22.

Other Embodiments

The present invention is not limited to the embodiments described above with reference to the drawings, and may include the following embodiments in the technical scope of the present invention.

Figure 6J:
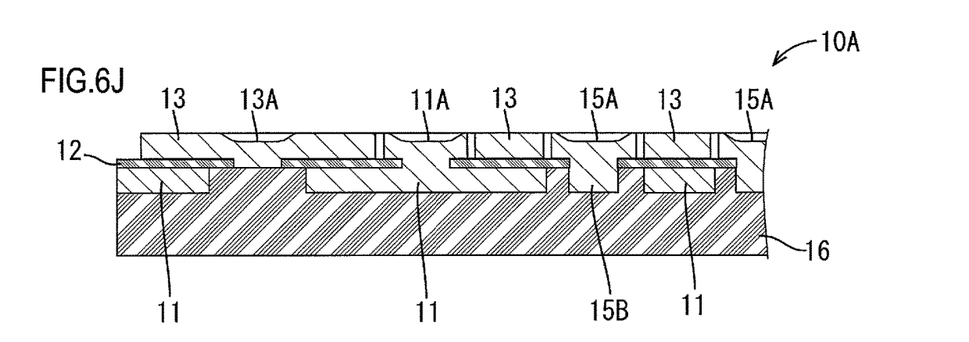
FIGS. 6J and 6K are schematic partial cross sectional views illustrating a method for manufacturing a circuit substrate (thin-film capacitor) according to another example.
Figure 6K:
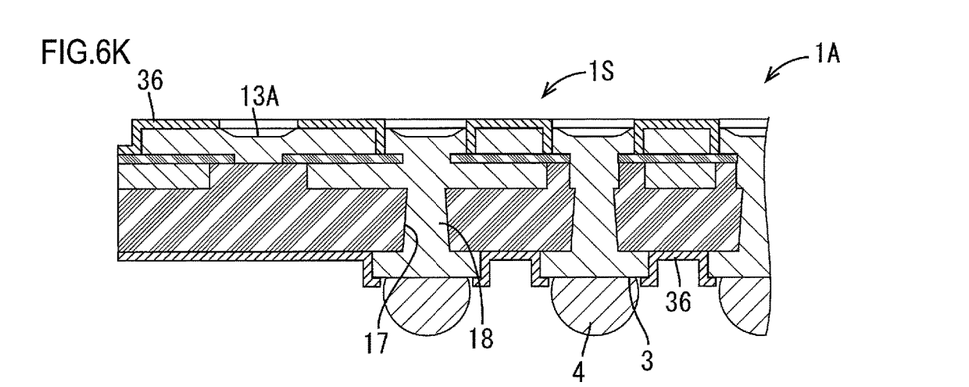

(1) As illustrated in FIG. 6K showing a substrate 1A, when it is not necessary for a part of the second electrode layer 13 of the thin-film capacitor to be connected to external circuitry via the solder balls 4, that part of the second electrode layer 13 may have the configuration of a thin-film capacitor 10A, as illustrated in FIG. 6J. Specifically, as illustrated in FIGS. 6J and 6K, the second electrode supplementary portions 13B of the second electrode layer 13 may not be formed. In this case, too, the step on the mounting surface 1S of the substrate 1 can be maintained only to be the difference due to the thickness of the dielectric layer 12, and also a stub structure, which may pose a problem in high frequency regions, can be avoided.

Figure 7J:
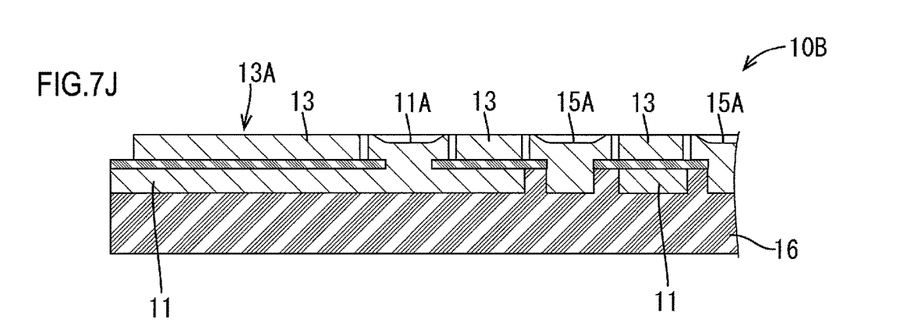
FIGS. 7J and 7K are schematic partial cross sectional views illustrating a method for manufacturing a circuit substrate (thin-film capacitor) according to another example.
Figure 7K:
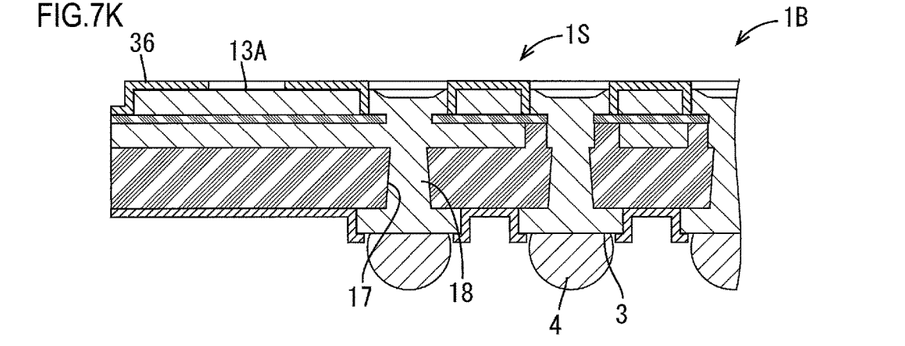

(2) As illustrated in FIG. 7K showing a substrate 1B, as in the substrate 1A illustrated in FIG. 6K, when it is not necessary for a part of the second electrode layer 13 of the thin-film capacitor to be connected to external circuitry via the solder balls 4, that part of the second electrode layer 13 may have the configuration of a thin-film capacitor 10B illustrated in FIG. 7J. Specifically, the through holes 12G may not be formed in the dielectric layer 12. In this case, the step on the mounting surface 1S of the substrate 1 can be maintained only to be the difference due to the thickness of the dielectric layer 12. Also, because the absence of the through holes 12G increases the electrode area of the thin-film capacitor 10, the capacity of the thin-film capacitor 10B can be increased.

Figure 8I:
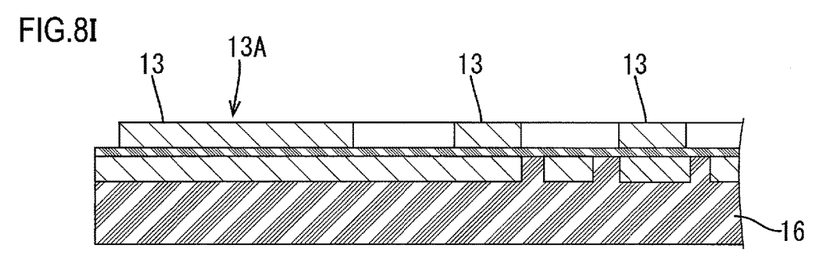
FIGS. 8I to 8K are schematic partial cross sectional views illustrating a method for manufacturing a circuit substrate (thin-film capacitor) according to another example.
Figure 8J:
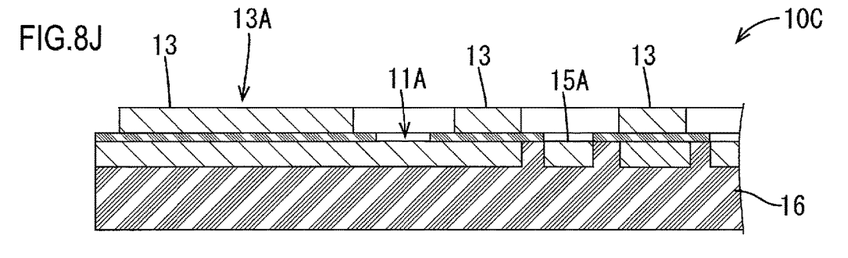
Figure 8K:
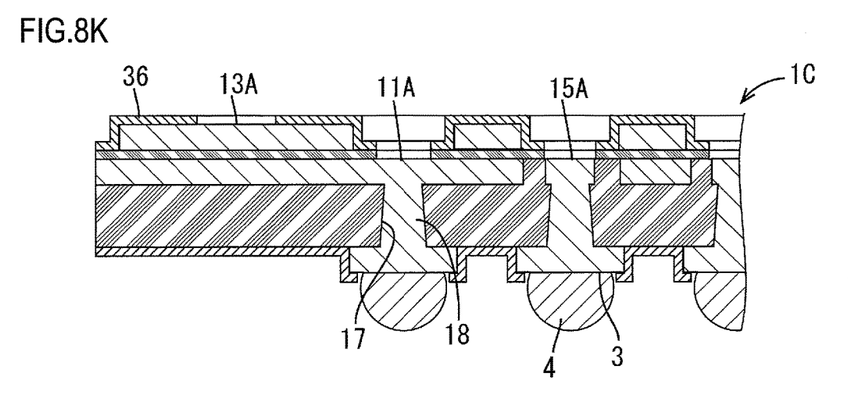

(3) As illustrated in FIGS. 8I and 8J, the order in which the second electrode layer 13 and the dielectric layer 12 are patterned may be reversed. That is, when a thin-film capacitor 10C that does not require the formation of the through holes 12G is formed as a configuration for connecting the second electrode layer 13 to external circuitry, the patterning of the dielectric layer 12 may be performed last, as illustrated in FIG. 8I. In this case, the step on the mounting surface is of the substrate 1 corresponds to the thickness of the dielectric layer 12 to which the thickness of the second electrode layer 13 is added. However, the connection structure for the bumps 22 of the LSI chip 2 and the thin-film capacitor 10C is the simplest of the structures according to the above-described present embodiment and the other embodiments (1) and (2). Specifically, the bumps 22 are connected to both the first electrode layer 11 and the second electrode layer 13 directly. Accordingly, the inductance associated with the connection between the bumps 22 of the LSI chip 2 and the thin-film capacitor 10A, i.e., impedance, can be minimized among the embodiments.

(4) While in the above embodiments the semiconductor device includes the flip-chip mounting substrate 1 and the LSI chip 2, this is not a limitation. The semiconductor device may further include a relay substrate 50 that extends the wiring pitch from the pitch of the bumps 22 of the LSI chip 2, as in a semiconductor device 100A illustrated in FIG. 9. In this case, the pitch extending function of the relay substrate 50 enables the semiconductor device to be mounted to an external substrate, such as a motherboard, that does not accommodate the pitch of the bumps 22 of the LSI chip 2, by appropriately adapting the pitch.

Figure 9:
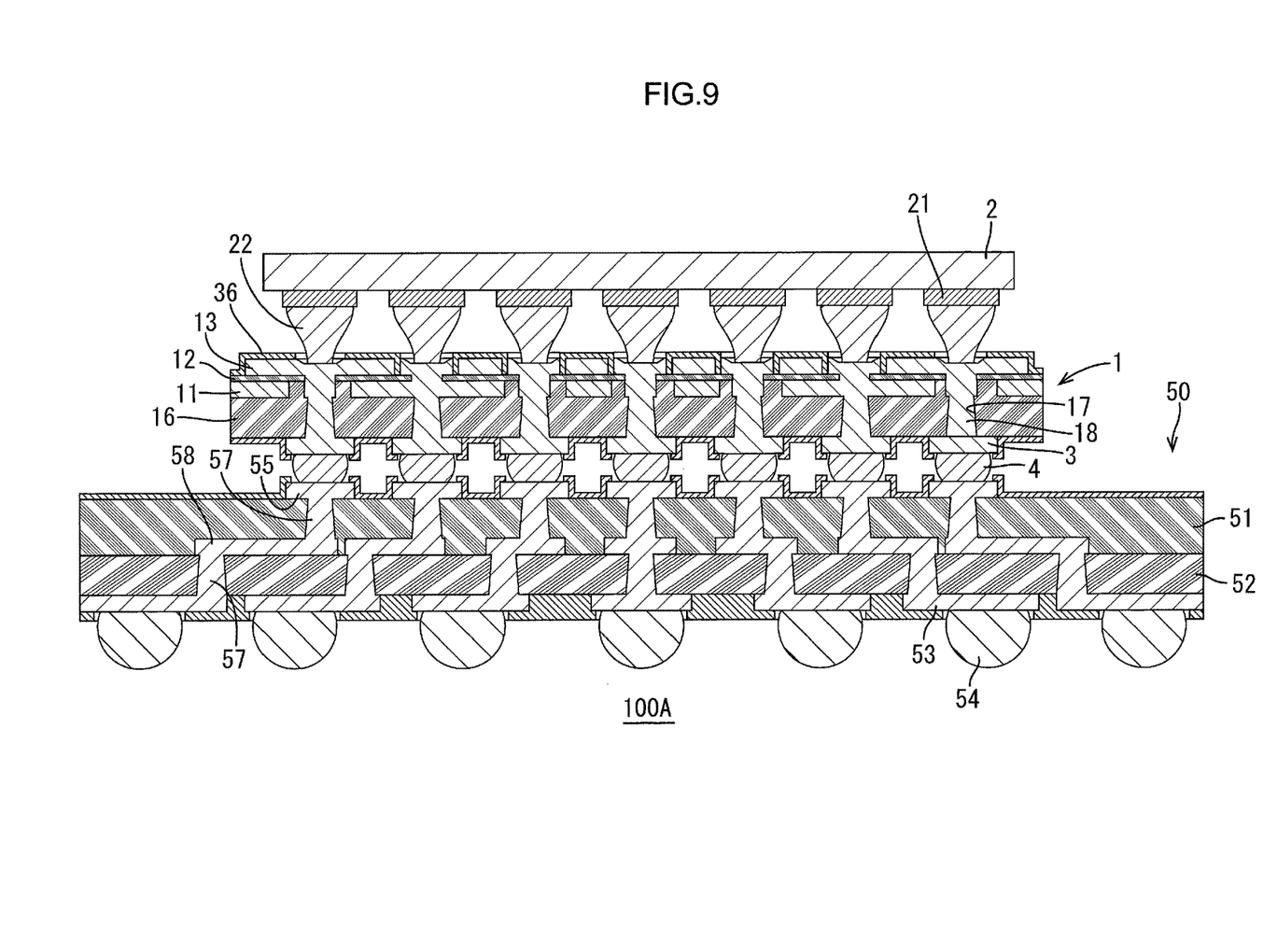
FIG. 9 is a schematic cross sectional view of a semiconductor device according to another example.

In this case, the relay substrate 50 includes, as illustrated in FIG. 9, two insulating layers, i.e., a first insulating layer 51 and a second insulating layer 52, for example. On the upper surface (front side surface) of the first insulating layer 51, connection pads 55 are formed as a first wiring layer for bonding the solder balls 4 of the substrate 1. On the upper surface of the second insulating layer 52, an intermediate wiring pattern 58 is formed as a second wiring layer for expanding the pitch of the solder balls 4, namely the pitch of the bumps 22 of the LSI chip 2. The connection of the connection pads 55 and the intermediate wiring pattern 58 is made by means of via plugs 57.

On the lower surface (back side surface) of the second insulating layer 52, a back surface wiring pattern 53 is formed as a third wiring layer for further increasing the pitch. The back surface wiring pattern 53 also provides solder bumps. On the back surface wiring pattern 53, solder balls 54 for mounting the semiconductor device 100A to the external substrate, such as a motherboard, are formed.

(5) In the above embodiments, the first electrode layer 11 serves as an electrode to which positive power supply voltage is applied, and the second electrode layer 13 serves as an electrode to which negative power supply voltage (ground voltage) is applied. However, this is not a limitation and the reverse may be the case. That is, the first electrode layer 11 may be used as the electrode to which ground voltage is applied, and the second electrode layer 13 may be used as the electrode to which positive power supply voltage is applied.

(6) In the foregoing embodiments, the circuit substrate in which the thin-film capacitor is formed is the flip-chip mounting substrate 1 having a single insulating layer, as illustrated in FIG. 1, for example. However, this is not a limitation, and the circuit substrate may be the relay substrate 50, which is a multi-layer substrate as illustrated in FIG. 9, instead of the flip-chip mounting substrate 1. That is, the thin-film capacitor may be formed in the relay substrate 50 illustrated in FIG. 9. In this case, the configuration of the semiconductor device will be the configuration of the semiconductor device 100A illustrated in FIG. 9 from which the configuration of the flip-chip mounting substrate 1 has been omitted.

The circuit substrate is not limited to the flip-chip mounting substrate 1 on which the LSI chip 2 is to be flip-chip mounted. The circuit substrate may be a substrate on which an electric or electronic component other than the LSI chip 2, such as an integrated memory circuit, for example, is to be mounted.

(7) In the foregoing embodiments, as illustrated in FIG. 1, for example, the thin-film capacitor is formed substantially throughout the mounting surface 1S of the insulator portion 16 (substrate 1). However, this is not a limitation, and the thin-film capacitor may be formed so that a part of the mounting surface 1S is left. In this case, in the remaining part of the mounting surface 1S, a wiring pattern for a signal line and the like may be formed by the second electrode layer 13. For example, in the dielectric patterning step of FIG. 4G, the dielectric layer 12 under the wiring pattern may be left. Generally, when a metal film, such as a Cu film, is formed on a resin substrate of BT resin and the like by sputtering, ion plating, or the like, the adhesion between the resin substrate and the metal film is weak. Accordingly, by adopting the structure in which a dielectric film is disposed between the resin substrate and the metal film, the adhesiveness of the metal film to the resin substrate can be increased.

EXPLANATION OF SYMBOLS

1: Flip-chip mounting substrate
2: LSI chip
3: External connection pad
4: Solder ball
10: Thin-film capacitor
11: First electrode layer (First electrode)
12: Dielectric layer
13: Second electrode layer (Second electrode)
16: Insulator portion
17: Via hole
18, 18A, 18B: Via plug
22: Bump (Au stud bump)
100: Semiconductor device

The invention claimed is:
1. A method for manufacturing a thin-film capacitor in a circuit substrate, the method comprising:
a dielectric film forming step of forming a dielectric film on a surface of a support member;
a first electrode forming step of forming a first electrode layer of the thin-film capacitor on the dielectric film in a required pattern;
a base material forming step of forming, on the dielectric film and the first electrode layer, an insulating base material of the circuit substrate so as to bury the first electrode layer;
a removal step of removing the support member and exposing a surface of the dielectric film on a side opposite to the first electrode layer;
a dielectric patterning step of patterning the dielectric film so as to leave a dielectric layer overlapping the first electrode layer, and forming a first through hole in the dielectric layer so as to expose a part of a surface, on a dielectric layer side, of the first electrode layer; and
a second electrode forming step of forming a second electrode layer of the thin-film capacitor so as to overlap the dielectric layer including an inside of the first through hole, wherein:
the circuit substrate is an integrated circuit mounting substrate on which an integrated circuit is to be mounted;
the second electrode forming step includes forming a first external connection portion connected to the first electrode layer, the first external connection portion being configured to be applied with a power supply voltage of one polarity for the integrated circuit, and being configured to be connected to the integrated circuit when the integrated circuit is mounted;
the second electrode layer includes a second external connection portion configured to be applied with a power supply voltage of the other polarity for the integrated circuit, and configured to be connected to the integrated circuit when the integrated circuit is mounted;
the first electrode forming step includes forming a second electrode supplementary portion at a position opposing the second external connection portion of the second electrode layer, the second electrode supplementary portion being connected to the second electrode layer; and
the dielectric patterning step includes forming a second through hole in the dielectric layer by removing the dielectric film at a position opposing the second electrode supplementary portion.

2. The method according to claim 1, wherein:
the first electrode forming step includes a first plating step of increasing a film thickness of the first electrode layer; and
the second electrode forming step includes a second plating step of increasing a film thickness of the second electrode layer.

3. An integrated circuit mounting substrate comprising:
an insulating base material having a mounting surface on which an integrated circuit is to be mounted; and
a thin-film capacitor formed on a mounting surface side of the insulating base material, and including a first electrode layer, a second electrode layer, and a dielectric layer formed between the first electrode layer and the second electrode layer, wherein:
the first electrode layer of the thin-film capacitor is formed so as to be buried in the insulating base material from the mounting surface;
the dielectric layer includes a first through hole in which a first external connection portion connected to the first electrode layer is formed, the first external connection portion being configured to be applied with a power supply voltage of one polarity for the integrated circuit, and being configured to be connected to the integrated circuit when the integrated circuit is mounted;
the second electrode layer of the thin-film capacitor is formed on the dielectric layer;
the first external connection portion is made of a metal film constituting the second electrode layer;
the second electrode layer includes a second external connection portion configured to be applied with a power supply voltage of the other polarity for the integrated circuit, and configured to be connected to the integrated circuit when the integrated circuit is mounted; and the dielectric layer includes a second through hole in which the second external connection portion is formed.

4. A semiconductor device comprising:
the integrated circuit mounting substrate according to claim 3; and
the integrated circuit mounted on the integrated circuit mounting substrate.

5. The semiconductor device according to claim 4, wherein:
the integrated circuit is a semiconductor chip; and
the semiconductor chip is flip-chip mounted on the integrated circuit mounting substrate.

6. An integrated circuit mounting substrate comprising:
an insulating base material having a mounting surface on which an integrated circuit is to be mounted; and
a thin-film capacitor formed on a mounting surface side of the insulating base material, and including a first electrode layer, a second electrode layer, and a dielectric layer formed between the first electrode layer and the second electrode layer, wherein:
the first electrode layer of the thin-film capacitor is formed so as to be buried in the insulating base material from the mounting surface;
the dielectric layer includes a first through hole in which a first external connection portion connected to the first electrode layer is formed, the first external connection portion being configured to be applied with a power supply voltage of one polarity for the integrated circuit, and being configured to be connected to the integrated circuit when the integrated circuit is mounted;
the second electrode layer of the thin-film capacitor is formed on the dielectric layer;
the first external connection portion is made of a metal film constituting the second electrode layer;
the second electrode layer includes a second external connection portion configured to be applied with a power supply voltage of the other polarity for the integrated circuit, and configured to be connected to the integrated circuit when the integrated circuit is mounted;
the dielectric layer includes a second through hole in which the second external connection portion is formed;
the thin-film capacitor includes a second electrode supplementary portion made of a metal film constituting the first electrode layer, and connected to the second external connection portion of the second electrode layer; and
the integrated circuit mounting substrate further comprises:
an external connection surface for external connection on a side opposite to the mounting surface;
a connection pad formed on the external connection surface;
a first via plug formed in the insulating base material and connecting the connection pad and the first electrode layer; and
a second via plug formed in the insulating base material and connecting the connection pad and the second electrode supplementary portion.

* * * * *